United States Patent
Zhao

(10) Patent No.: US 7,205,773 B1
(45) Date of Patent: Apr. 17, 2007

(54) METHOD FOR CALIBRATING A PULSED MEASUREMENT SYSTEM

(75) Inventor: Yuegang Zhao, Solon, OH (US)

(73) Assignee: Keithley Instruments, Inc., Cleveland, OH (US)

( * ) Notice: Subject to any disclaimer, the term of this patent is extended or adjusted under 35 U.S.C. 154(b) by 0 days.

(21) Appl. No.: 10/953,625

(22) Filed: Sep. 29, 2004

(51) Int. Cl.
*G01R 35/00* (2006.01)
*G01R 27/08* (2006.01)
*G01R 31/02* (2006.01)

(52) U.S. Cl. ............... 324/601; 324/715; 324/72.5
(58) Field of Classification Search ............... 324/601
See application file for complete search history.

(56) References Cited

U.S. PATENT DOCUMENTS

| 4,608,657 | A | * | 8/1986 | Manome et al. ............... 702/89 |
| 6,201,400 | B1 | * | 3/2001 | Lind .......................... 324/687 |
| 6,801,042 | B2 | * | 10/2004 | Mc Pherson et al. ....... 324/601 |
| 2003/0030426 | A1 | * | 2/2003 | Pickerd .................... 324/76.58 |
| 2006/0088655 | A1 | * | 4/2006 | Collins et al. ................. 427/8 |

OTHER PUBLICATIONS

"Characteristics of SOI FET's Under Pulsed Conditions", Keith A. Jenkins, J. Y.-C. Sun, Senior Member, IEEE, and J. Gautier, IEEE Transactions on Electron Devices, vol. 44, No. 11, Nov. 1997.

* cited by examiner

*Primary Examiner*—Andrew H. Hirshfeld
*Assistant Examiner*—Jeff Natalini
(74) *Attorney, Agent, or Firm*—Pearne & Gordon LLP

(57) ABSTRACT

A method for calibrating a pulsed measurement system, the system having a pulse generator unit, a measurement unit and a probe unit having a first and a second probe tip. The first tip, the pulse generator unit and the measurement unit are all interconnected by respective cables to a power divider network and an additional cable connects the second tip to the measurement unit. The method includes determining the transfer characteristics of the power divider network; measuring the characteristics of the system with the probe tips being open; measuring the characteristics of the system with the probe tips being interconnected; and calculating calibration constants for the system from the measurements and the transfer characteristics. The measurements are performed for pulses having specific characteristics.

3 Claims, 2 Drawing Sheets

METHOD FOR CALIBRATING A PULSED MEASUREMENT SYSTEM

BACKGROUND OF THE INVENTION

The present invention relates to the measurement of I-V characteristics for semiconductor devices and, in particular, to the use of pulses in such measurements.

It is well known to characterize semiconductor devices according to their I-V curves and similar measurements. Historically, such measurements are made with DC signals applied and measured. However, these DC measurements are not always suitable. For example, in many cases, these DC measurements result in significant heating of the devices resulting in measurements of little value.

The use of pulsed measurements has been proposed to avoid these issues, but has not been satisfactorily implemented. One of the difficult issues has been calibrating the measurement system.

SUMMARY OF THE INVENTION

A method for calibrating a pulsed measurement system, the system having a pulse generator unit, a measurement unit and a probe unit having a first and a second probe tip. The first tip, the pulse generator unit and the measurement unit are all interconnected by respective cables to a power divider network and an additional cable connects the second tip to the measurement unit. The method includes determining the transfer characteristics of the power divider network; measuring the characteristics of the system with the probe tips being open; measuring the characteristics of the system with the probe tips being interconnected; and calculating calibration constants for the system from the measurements and the transfer characteristics. The measurements are performed for pulses having specific characteristics.

DESCRIPTION OF THE PREFERRED EMBODIMENTS

Figure 1:
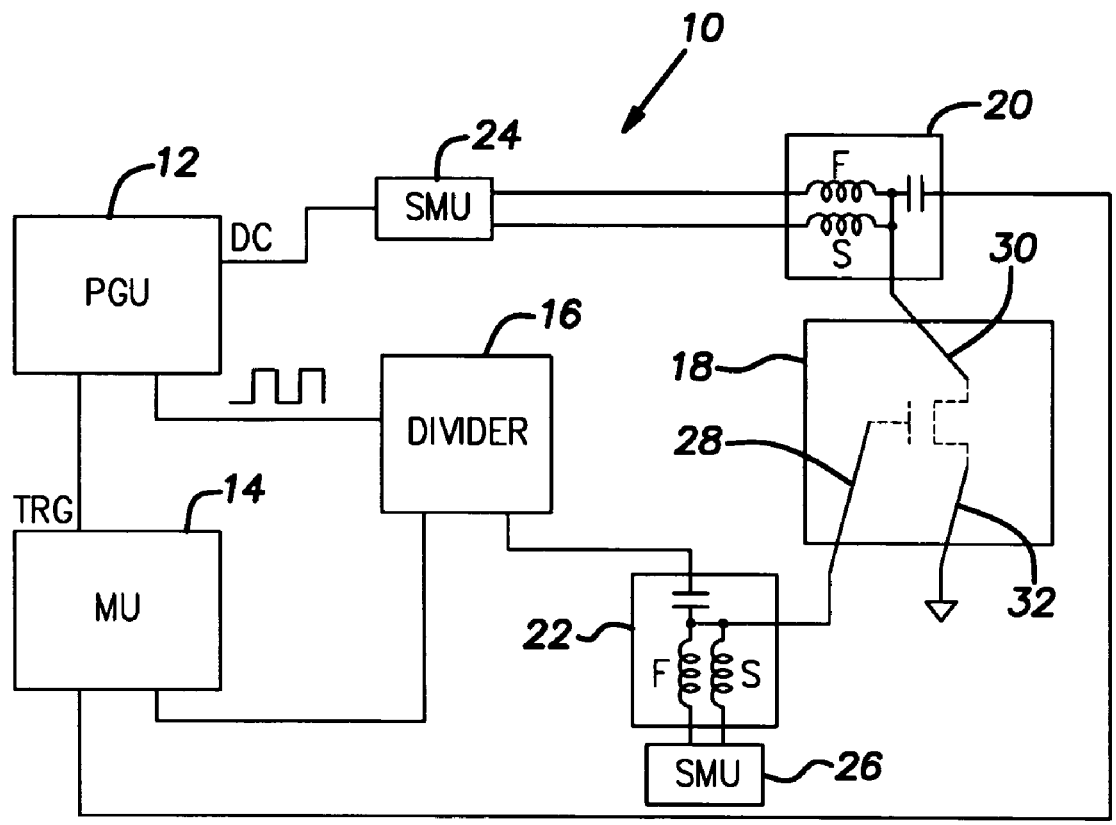
FIG. 1 is a schematic diagram of an exemplary pulsed measurement system, which may be calibrated according to the invention.

Referring to FIG. 1, an exemplary pulsed measurement system 10 includes a pulse generator unit 12, a measurement unit 14, a power divider 16 and a probe unit 18. In addition, with respect to DC signals, the system 10 includes bias tees 20, 22 and source measure units 24, 26.

The source measure units 24, 26 are capable of very accurately forcing voltage and measuring current or vice versa. The bias tees 20, 22 allow DC to reach the probe unit 18 while blocking AC from the DC portion of the system 10 and allowing AC signals to circulate in the AC portion of the system 10. In particular, a DC bias would be applied to a device under test being probed by the probe unit 18, as well as AC signals being applied/measured by the system 10.

Figure 2:
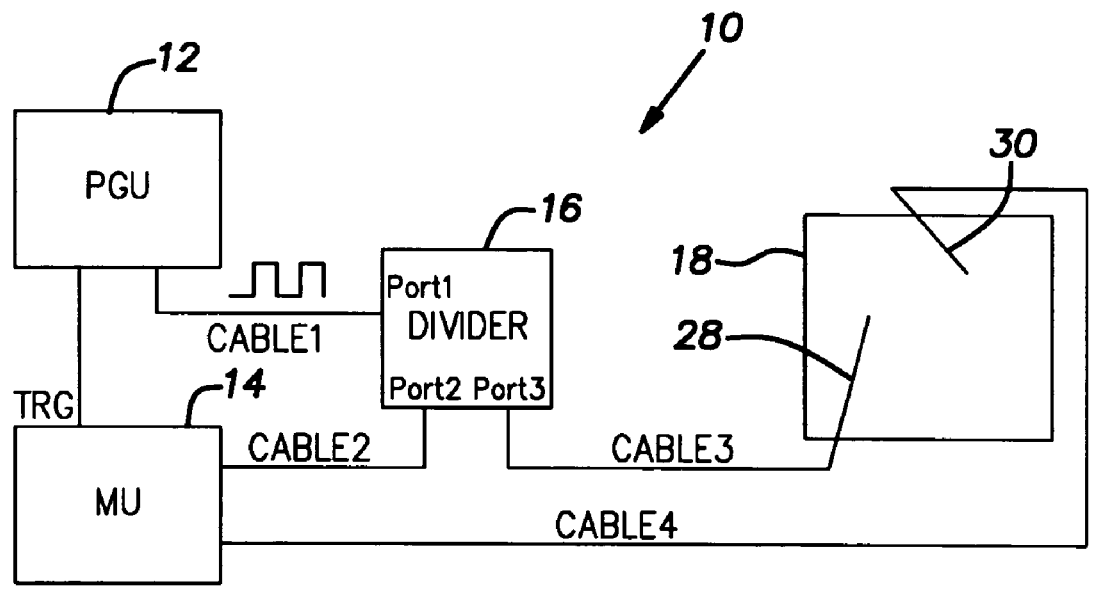
FIG. 2 is a schematic diagram of the AC portion of the system of FIG. 1.

Referring to FIG. 2, the AC portion of the system 10 that will be calibrated is shown to make the process more easily understood. In this case, by way of example, the system 10 is configured to apply pulses via the first probe 28 to the gate of an FET and the drain voltage/current would be measured via the second probe 30. A third probe 32 provides the FET source connection.

The cable 1 connects the unit 12 to the power divider 16, the cable 2 connects the power divider 16 to the measurement unit 14, the cable 3 connects the power divider 16 to the probe 28 and the cable 4 connects the probe 30 to the measurement unit 15. The cables may be, for example, 50 ohm coaxial cable.

The pulse generator unit 12 supplies pulses having specific characteristics such as pulse width, pulse rate and amplitude. Pulse width and the related parameters such as rise and fall time are particularly of interest. In general the calibration method of the invention needs to be performed for specific pulse characteristics. It also may be used to supply the basic DC bias as shown in FIG. 1.

The measurement unit 14 may be, for example, an oscilloscope, or other device capable of high bandwidth measurements of voltage/current.

As pulses travel through the cables, power divider, and bias tees, part of the signal level is lost due to resistance. Because of this lost signal, there are errors in sourcing correct pulses onto the terminals of a device under test. Meanwhile, when current pulse travels to the measurement unit 14, there are errors in getting the right amplitude of the current. Calibration is critical for deploying pulse I-V technique for practical use. Without calibration pulse I-V measurement typically shows about 10% to 20% error.

In general, the calibration method of the invention involves an "open" calibration and a "through" calibration. Open calibration is done without any device under test connected. This is to simulate the gate terminal of a transistor, which is in high impedance state. Through calibration is done on a RF "through" device, with signals and grounds of two prober tips shorted together respectively.

As part of the invention, the transfer characteristics of the power divider 16 need to be measured. A divider may be purchased with this information included or simple measurements for specific pulse characteristics would be performed.

In particular, the transfer coefficients from port 1 to port 2, $A_{12}$, from port 1 to port 3, $A_{13}$, and from port 2 to port 3, $A_{23}$ are needed.

For the system 10 in the open configuration, i.e., the probes 28, 30 not connected to a device under test (basically just measuring the reflection of the applied pulse).

$$V_m = \beta_1 V_o = [A_{12}L_1L_2 + A_{13}A_{23}L_2L_3]V_o \tag{1}$$

Where $V_o$ is the specified output pulse from the pulse generator, $V_m$ is voltage measured at the measurement unit and $L_1$, $L_2$, $L_3$, and $L_4$ are the respective loss factors of cable 1, cable 2, cable 3 and cable 4 respectively.

So $$\beta_1 = A_{12}L_1L_2 + A_{12}A_{23}L_1L_2L_3 \tag{2}$$

For the system 10 in the "through" configuration, i.e., the probes 28, 30 shorted together. There are two components to $V_m$, $V_{m1}$ from the divider and $V_{m2}$ from the probe 30.

$$V_{m1} = \beta_2 V_o = A_{12}*L_1*L_2*V_o \tag{3}$$

$$V_{m2} = \beta_3 V_o = A_{13}*L_1*L_3*L_4*V_o \tag{4}$$

Therefore:

$$\beta_2 = A_{12} * L_1 * L_2 \quad (5)$$

and $$\beta_3 = A_{13} * L_1 * L_3 * L_4 \quad (6)$$

From (2), (5) and (6), one can solve $L_1$, $L_2$, $L_3$, and $L_4$: Assuming cable 1 and cable 2 are identical, $$L_1 = L_2 = \sqrt{\frac{\beta_2}{A_{12}}}$$

$$L_3 = \sqrt{\frac{(\beta_1 - \beta_2)}{\beta_2} * \frac{A_{12}}{A_{13} A_{23}}}$$

$$L_4 = \beta_3 \sqrt{\frac{A_{23}}{A_{13}(\beta_1 - \beta_2)}}$$

These then can be used to calculate calibration constants, for example:

$$V_{Gate} = 2 A_{13} L_1 L_3 V_0 \text{ or }$$

$$V_0 = \frac{V_{Gate}}{2 A_{13} L_1 L_3}$$

similarly $$V_{gate_{Measured}} = \frac{V_{m1}}{A_{23} L_2} \text{ and}$$

$$V_{Drain} = \frac{V_{Drain_{Measured}}}{L_4}$$

then a set of calibration constants can be calculated. Included in this set are $A_{gs}$ (gate pulse source correction constant), $A_{gm}$ (gate voltage monitoring correction constant), and $A_{dm}$ (drain current measurement correction constant), where $V_0 = V_{gate} * A_{gs}$, $V_{gatemeasured} = A_{gm} * V_{m1}$ and $V_{drainmeasured} = A_{dm} * V_{m2}$.

$$A_{gs} = \frac{1}{2 A_{13} L_1 L_3}$$

$$A_{gm} = \frac{1}{A_{23} L_2}$$

$$A_{dm} = \frac{1}{L_4}$$

Figure 3:
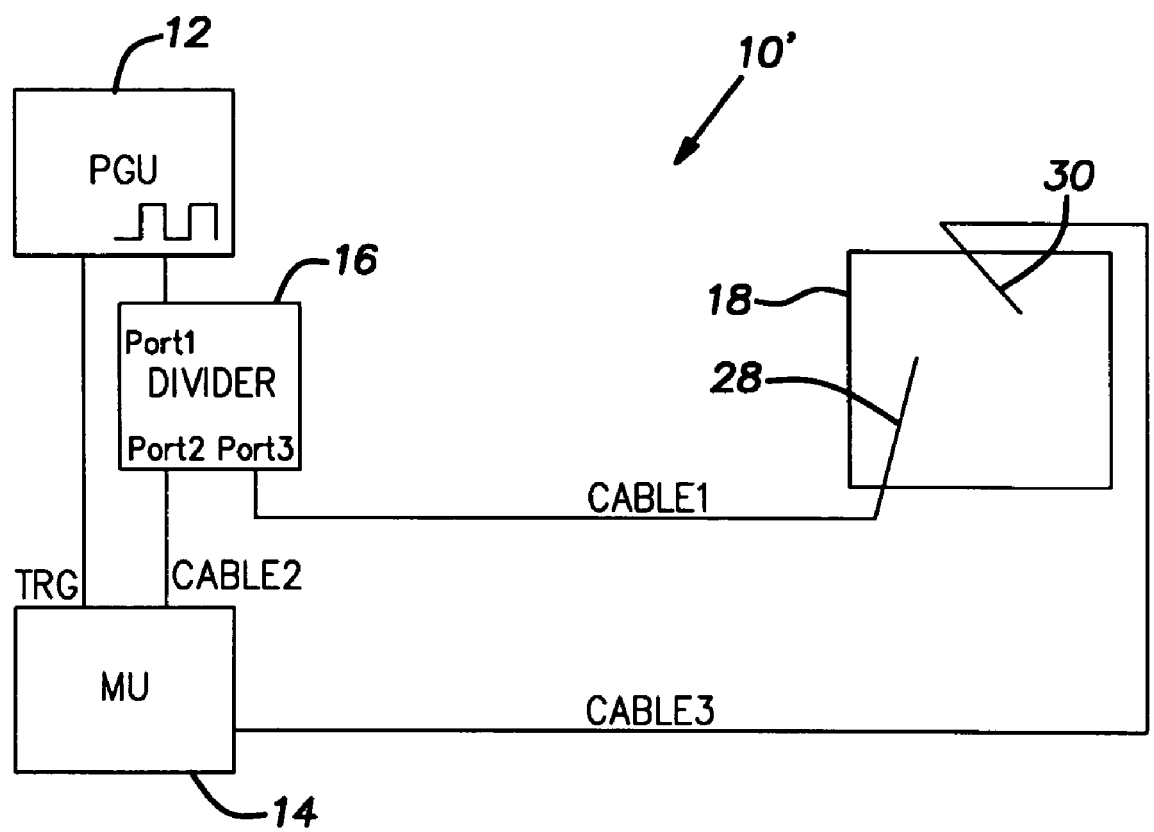
FIG. 3 is a schematic diagram of a modified version of the system of FIG. 2.

Referring to FIG. 3, a variation on system 10 as shown in FIG. 2 is shown where cable 1 is shortened to the point where its loss factor is inconsequential compared to the other cables and the cables are renumbered accordingly. This configuration introduces less error and requires less computation to calibrate.

Open calibration: Open calibration is done at each desired pulse width with nothing connected to the probes. The only thing measured here is the reflection pulse from the probe 28 ($V_m$). And $$V_m = \beta_1 V_o = A_{12} * A_{32} * L_1^2 * L_2 * V_o, \quad (7)$$

Where $V_o$ is the nominated output pulse from pulse generator.

So $$\beta_1 = A_{12} * A_{32} * L_1^2 * L_2 \quad (8)$$

For through calibration, cables 1 and 3 are tied together via a "through" device. There are two measurements in this calibration, $V_{m1}$, which is the pick-off signal through cable 2, and $V_{m2}$, which is the transmitted signal through cable 3.

$$V_{m1} = \beta_2 V_o = A_{12} * L_2 * V_o \quad (9)$$

$$V_{m2} = \beta_3 V_o = A_{13} * L_1 * L_3 * V_o \quad (10)$$

Therefore:

$$\beta_2 = A_{12} * L_2 \quad (11)$$

and $$\beta_3 = A_{13} * L_1 * L_3 \quad (12)$$

From (2), (5) and (6), one can solve $L_1$, $L_2$, and $L_3$:

$$L_1 = \sqrt{\frac{A_{13}}{A_{12} A_{32}}} \sqrt{\frac{\beta_1}{\beta_2}} \quad (13)$$

$$L_2 = \frac{\beta_2}{A_{12}} \quad (14)$$

$$L_3 = \frac{\beta_3}{A_{13} L_1} \quad (15)$$

From the loss factor, a set of calibration constants can be calculated. Included in this set are $A_{gs}$ (gate pulse source correction constant), $A_{gm}$ (gate voltage monitoring correction constant), and $A_{dm}$ (drain current measurement correction constant).

$$A_{gs} = \frac{1}{2 A_{12} L_1} = \frac{1}{2} \sqrt{\frac{A_{13} A_{12}}{A_{32}}} \sqrt{\frac{\beta_2}{\beta_1}} \quad (16)$$

$$A_{gm} = A_{32} L_1 L_2 = \sqrt{\frac{A_{32}}{A_{12} A_{13}}} \sqrt{\beta_1 \beta_2} \quad (17)$$

$$A_{dm} = \frac{1}{L_2} = \sqrt{\frac{A_{12} A_{13}}{A_{32}}} \sqrt{\frac{\beta_1}{\beta_2}} \frac{1}{\beta_3} \quad (18)$$

It should be noted that all of the above constants measured/derived are real numbers as opposed to complex numbers.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A method for calibrating a pulsed measurement system, said system having a pulse generator unit, a measurement unit and a probe unit having a first and a second probe tip, said first tip, said pulse generator unit and said measurement unit all interconnected by respective cables to a power divider network and an additional cable connecting said second tip to said measurement unit, said method comprising:
- determining the transfer characteristics of said power divider network;
- measuring characteristics of said system with said probe tips being open;
- measuring characteristics of said system with said probe tips being interconnected; and
- calculating at least one of a gate pulse source correction constant, a gate voltage monitoring correction constant, and a drain current measurement correction constant for said pulsed measurement system from said measurements and the transfer characteristics, said measurements being performed for pulses having specific characteristics.

2. A method according to claim 1 wherein all of said characteristics and constants are real values.

3. A method according to claim 1, wherein at least one cable has inconsequential losses in comparison to all other cables.

* * * * *